US006636057B1

(12) United States Patent
Uchikura (10) Patent No.: US 6,636,057 B1
(45) Date of Patent: Oct. 21, 2003

(54) ELECTRIC PART TESTING APPARATUS WITH MOVABLE ADAPTER

(75) Inventor: Youji Uchikura, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/667,753

(22) Filed: Sep. 21, 2000

(30) Foreign Application Priority Data

Oct. 20, 1999 (JP) .......................................... 11-298081

(51) Int. Cl.[7] .............................................. G01R 31/02
(52) U.S. Cl. ...................... 324/754; 324/761; 324/755; 324/158.1
(58) Field of Search ....................... 324/158.1, 754, 324/761, 762, 758, 755; 439/482, 66, 700, 824

(56) References Cited

U.S. PATENT DOCUMENTS

| | | | | |
|---|---|---|---|---|
| 4,773,877 A | * | 9/1988 | Kiiger et al. ............... | 439/482 |
| 5,453,701 A | * | 9/1995 | Jensen et al. .............. | 324/755 |
| 5,479,105 A | * | 12/1995 | Kim et al. .................. | 324/755 |
| 5,500,605 A | * | 3/1996 | Chang ........................ | 324/758 |
| 5,656,943 A | * | 8/1997 | Montoya et al. ............ | 324/754 |
| 5,821,763 A | * | 10/1998 | Beaman et al. ............. | 324/754 |
| 5,828,224 A | * | 10/1998 | Maruyama .................. | 324/755 |
| 5,955,888 A | * | 9/1999 | Frederickson et al. ...... | 324/761 |
| 6,037,787 A | * | 3/2000 | Corwith ...................... | 324/754 |
| 6,188,230 B1 | * | 2/2001 | Birk ............................ | 324/754 |
| 6,204,680 B1 | * | 3/2001 | Swart et al. ................. | 324/761 |
| 6,265,886 B1 | * | 7/2001 | Hamren ...................... | 324/755 |

FOREIGN PATENT DOCUMENTS

| | | |
|---|---|---|
| JP | 2-234370 | 9/1990 |
| JP | 5-10971 | 1/1993 |
| JP | 5-256875 | 10/1993 |
| JP | 6-18557 | 1/1994 |

* cited by examiner

*Primary Examiner*—Kamand Cuneo
*Assistant Examiner*—Jimmy Nguyen
(74) *Attorney, Agent, or Firm*—Armstrong, Westerman & Hattori, LLP (57) ABSTRACT

Testing apparatus for an electronic part having first and second pins includes an adapter having through-holes, and a testing plate having pads. Connecting members are arranged in the through-holes of the adapter, each connecting member including a pin contact portion, a pad contact portion, and a spring between the pin and pad contact portions. Top surfaces of pin contact portions are within the through-holes so that pins can be inserted into through-holes above the pin contact portions. The top surface of the first pin contact portion is higher than that of the second pin contact portion. The adapter is movably supported by the testing plate. During the test, as the electronic part is pressed toward the adapter, the first pins contact the first pin contact portions and the first test is carried out, first and second pins then contact first and second pin contact portions, and the adapter is then moved toward the testing plate to further enhance the connection and second test is carried out.

19 Claims, 9 Drawing Sheets

ELECTRIC PART TESTING APPARATUS WITH MOVABLE ADAPTER

BACKGROUND OF THE INVENTION

1. Field of the Invention

The present invention relates to an electronic part testing apparatus for testing the connectability of a wiring pattern of an electronic part such as an MCM (multi-chip module), a PGA (pin-grid array) package, a BGA (ball-grid array) package, etc., and it also relates to an electric connecting member which can be used for various electronic devices including an electronic part testing apparatus, for electrical connection between a circuit substrate and an electronic part or between electronic parts.

2. Description of the Related Art

An electronic part such as an MCM (multi-chip module), a PGA (pin-grid array) package, a BGA (ball-grid array) package, etc. includes a plurality of test terminal pins (hereinafter referred to as "test pins") for testing connections to the wiring pattern, a plurality of test control input/output terminal pins (hereinafter referred to as "control pins"), and a boundary scanning circuit for observing a result of the test, by independently controlling the voltage of test pins via the control pins. The test of the connectability of the wiring pattern of the electronic part is carried out prior to the shipment of the electronic part or at the time of maintenance. The electronic part testing apparatus includes an adapter for carrying out this test. A conventional adapter is explained with reference to FIGS. 11 to 14.

Figure 11:
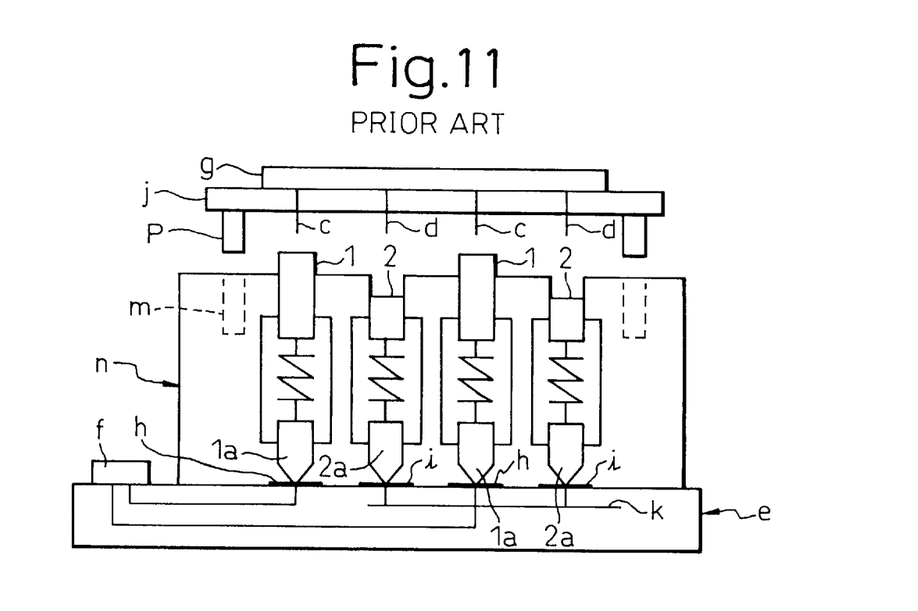
FIG. 11 is a schematic cross-sectional-view showing a conventional electronic part testing apparatus.

As shown in FIG. 11, an electronic circuit testing adapter "n" (hereinafter referred to as an "adapter") is made of an electrically insulating material such as a resin, and has holes at positions corresponding to test pins "d" of an electronic part "g" to be tested and holes at positions corresponding to positions of control pins "c". First connecting members or assemblies "1" for electrical connection with the control pins "c" and second connecting members or assemblies 2 for electrical connection with the test pins "d" are disposed in the corresponding holes. The upper surface of each first connecting member 1 projects above the surface of the adapter "n". The first and second connecting members 1 and 2 have contact portions 1a and 2a on the lower surface of the adapter "n", respectively.

Further, below the adapter "n", there is disposed a testing substrate "e" having pads "h" corresponding to the contact portions 1a and pad "i" corresponding to the contact portions 2a. The connecting member 2 is in contact with the pad "i" at the contact portion 2a. All the pads "i" are short-circuited by a short-circuit layer "k" within the testing substrate "e". Further, the connecting member 1 is in contact with the pad "h" at the contact portion 1a, and all the pads "h" are independently connected to the connector "f" of the testing substrate "d" in a predetermined pattern within the testing substrate "e".

Figure 12:
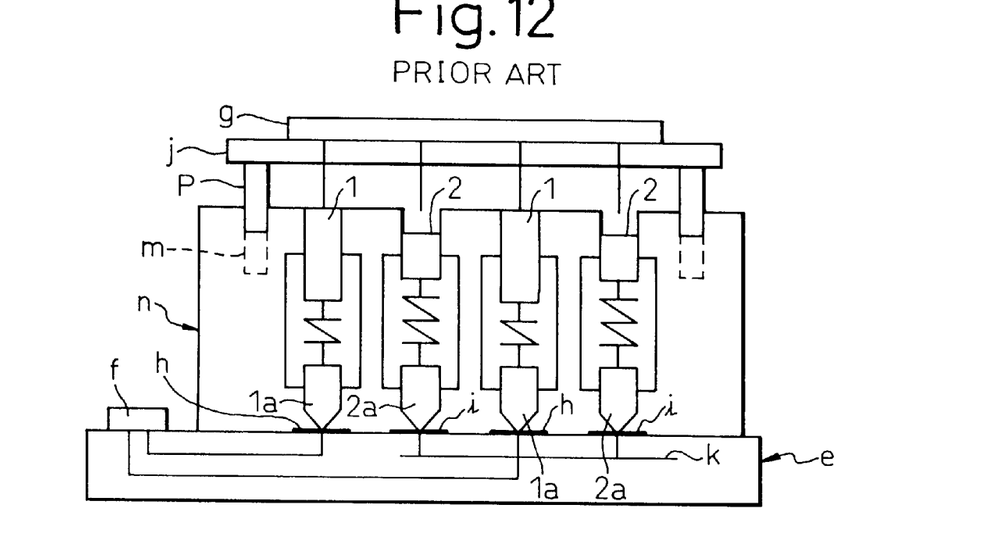
FIG. 12 is a schematic cross-sectional view illustrating the operation of the conventional electronic part testing apparatus of FIG. 11.

A test procedure will be explained next. First, a positioning member "j" for positioning the electronic part "g" and the adapter "n" having the above-described circuits is disposed on the outside of the adapter "n". After the electronic part "g" is positioned and fixed to the positioning member j, the electronic part "g" and the positioning member "j" are pressed downward while matching guide pins "p" of the positioning member "j" with positioning holes "m" of the adapter "n". Then, the guide pins "p" are inserted into the positioning holes "m", and the control pins "c" are brought into contact with the connecting members 1 that are stretched above the upper surface of the adapter "n". When the electronic part "g" and the positioning member "j" are further pressed downward, as shown in FIG. 12, the connecting members 1 move downward while compressing coil springs in the adapter "n", and stop. At this time, the test pins "d" are not brought into contact with the connecting members 2, and are in a released state. In this state, a voltage is applied to the control pins "c" of the electronic part "g" from a main testing part (not shown) via the connector "f" to test for the electrical short-circuiting of the test pins "d" (a test state at step 1).

Figure 13:
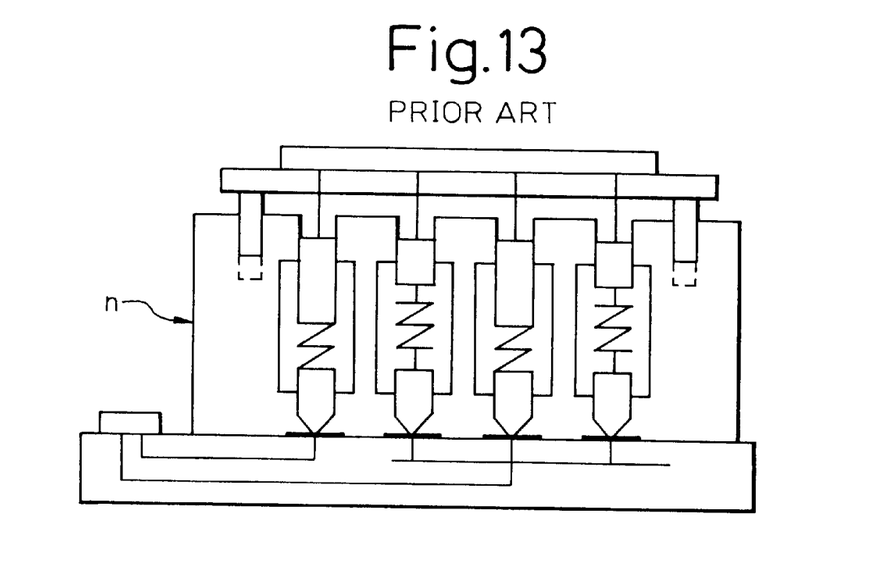
FIG. 13 is a schematic cross-sectional view illustrating the operation of the conventional electronic part testing apparatus of FIG. 11.

When the electronic part "g" and the positioning member "j" are further pressed downward, as shown in FIG. 13, the connecting members 1 are pressed in the adapter "n" while keeping a connection with the control pins "c". At this time, the test pins "d" are brought into contact with the connecting members 2. A voltage is applied to the control pins "c" of the electronic part "g" via the connector "f" in a state that each test pin "d" is short-circuited by the connecting member 2 that is short-circuited via a short-circuit layer "k" of the testing substrate "e" and the pad "i". In this way, an electrical continuity (breakage) test of the pins "d" is carried out (a test state at step 2).

Figure 14:
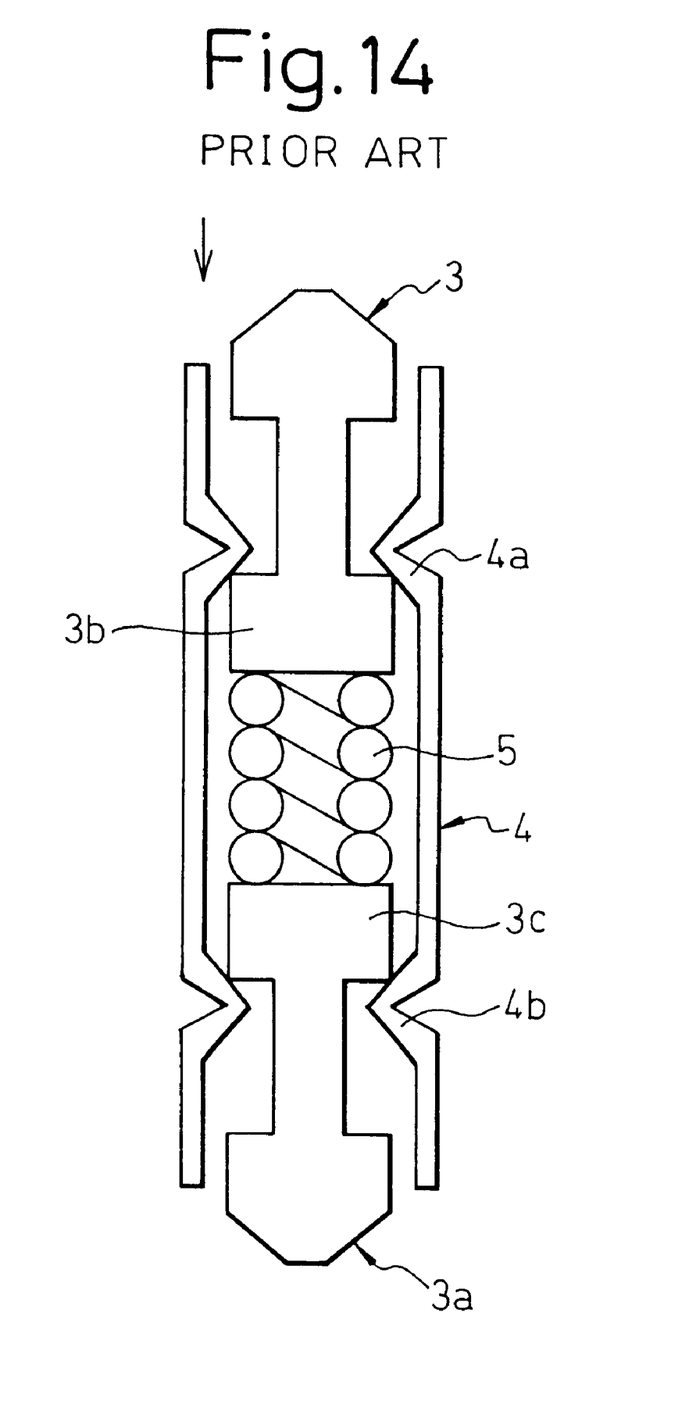
FIG. 14 is a cross-sectional view showing a conventional probe structure used as the connecting device of the electronic part testing apparatus of FIG. 11.

FIG. 14 shows a structure of a conventional probe that secures a connecting member within the adapter "n". Caulks 4a and 4b are provided in a cylinder 4 that secures a connecting member 3. A movable portion 3b of the connecting member 3 and a movable portion 3c on the side of the contact portion 3a are disposed between the caulks 4a and 4b. Further, a coil spring 5 is disposed in a compressed state between the movable portions 3b and 3c. When the connecting member 3 is pressed downward, the connecting member 3 moves within a movable range. The connecting member 3 and the contact portion 3a are brought into contact with the pin of the electronic part and the pad of the testing substrate while being urged by the coil spring 5.

In the conventional positional mechanism of the adapter as shown in FIG. 11 to FIG. 13, there is no problem if the number of pins to be tested is small. However, when a large electronic part has a large number of pins like a few thousand terminals, for example, 3,000 terminals, it is difficult to ensure high precision in the positioning member that fixes the electronic part and supports this large number of pins. Further, it is also difficult to ensure high precision in the position of the position member that positions the adapter.

There may be considered a method of carrying out the above test at step 1 and the test at step 2 by using two separate adapters so that each adapter carries out an exclusive test. However, the use of the two kinds of adapters increases the cost of the adapters. Further, as the test is not finished at one time and is carried out at two divided times, the process of setting up the short-circuit test and the current conduction test increases. As a result, it takes a long time for the tests, which is not desirable.

Further, when the probe has such a structure that the portion for securing the connecting member is integrated with the connecting member, the cost of a connecting member for carrying out the test increases in the case of a large electronic part that has a few thousand test pin terminals. This leads to an increase in the cost of the adapter and the testing apparatus. Further, in the probe structure as shown in FIG. 14, the caulks are formed at two positions in the state that the movable portion of the connecting member and the coil spring are accommodated in the cylinder. Therefore, this results in a complex structure of the cylinder, and the cost of the members further increases.

Further, in the case of electrical connection between the electronic part and the testing substrate as described above, and also generally in the case of electrical connection between an electronic part and a substrate or between an electronic part and another electronic part, a secure electrical connection is always required. Further, a simple structure, not involving a high cost and providing ease of maintenance, is also required.

SUMMARY OF THE INVENTION

It is a first object of the present invention to provide an electronic part testing apparatus capable of securely carrying out an electrical connection between an electronic part and a testing member at the time of testing a connectability of a wiring pattern of the electronic part.

It is a second object of the present invention to provide an electronic part testing apparatus capable of successively carrying out a plurality of tests by using the same apparatus without using a positioning member for fixing an electronic part and positioning a large number of pins.

It is a third object of the present invention to provide an electric connecting member capable of securing an electrical connection between an electronic part and a testing member and further capable of securing an electrical connection between an electronic part and a substrate or between an electronic part and another electronic part in general by using the above electronic part testing apparatus with a low cost simple structure.

In order to achieve the above object, the present invention provides an electronic part testing apparatus for testing a connectability of a wiring pattern of an electronic part having a plurality of terminals. The electronic part testing apparatus comprises: a testing, member having an electrical connection pattern, the electrical connection pattern being electrically connected to the terminals of the electronic part for the test; an adapter positioned between the electronic part and the testing member and establishing an electrical connection between the terminals and the electrical connection pattern when the electronic part is mounted on the adapter for the test. In this case, when the electronic part is pressurized against the adapter for carrying out the electrical connection, the adapter can move in this pressing direction.

In this electronic part testing apparatus, at the time of electrically connecting the terminals of the electronic part to be tested to the tester member, when the electronic part is pressed down, the terminals are pressed against the adapter and an electrical connection of the terminals with the adapter is established. Further, the whole adapter is pressed while moving toward the testing member. Therefore, it is possible to obtain a more secure electrical connection between the adapter and the testing member. Thus, it is possible to securely carry out the test of the electronic part.

In this case, it is preferable that an elastic member is disposed between the adapter and the testing member. With this arrangement, the electronic part can be pressed against the adapter smoothly and securely. Further, the adapter and the testing member can be electrically connected more securely. When the pressure is cancelled, the original state is easily obtained based on the restoring force of the elastic member, which is convenient for proceeding to the next test process. Further, there may be further provided a guide member that is fixed to the testing member and is engaged in a hole formed in the adapter. The adapter may be supported by the guide member in the hole, and may be movable along the guiding member in the pressing direction and in the opposite direction. With this arrangement, the adapter can move in the pressing direction and in the opposite direction while being supported by the guide member.

In a further aspect of the invention, there is provided an electronic part testing apparatus for testing a connectability of a wiring pattern of an electronic part having a plurality of terminals. The electronic part testing apparatus comprises: a testing member having an electrical connection pattern, the electrical connection pattern being electrically connected to the terminals of the electronic part for the test; and an adapter positioned between the electronic part and the testing member and establishing an electrical connection between the terminals and the electrical connection pattern when the electronic part is mounted on the adapter for the test. In this case, the terminals include a plurality of first terminals and a plurality of second terminals. For carrying out the electrical connection, the adapter accommodates first connecting members in holes corresponding to the first terminals so that terminal contact surfaces of the first connectors are positioned within the holes, and accommodates second connectors within holes corresponding to the second terminals so that terminal contact surfaces of the second connectors are positioned within the holes. Further, the terminal contact surfaces of the first connecting members within the holes are located at a position higher than the terminal contact surfaces of the second connectors within the holes.

In this electronic part testing apparatus, the terminal contact surfaces of the first and second connecting members do not project above the adapter, and are within the holes of the adapter. It is possible to mount the electronic part in the adapter so that the terminals can enter the holes at the time of carrying out the test. Therefore, it is not necessary to particularly position the electronic part in the adapter. Thus, a positioning member that has been conventionally required is not necessary. As a result, the apparatus can be provided with a simple structure and with a smaller number of parts. This makes it possible to achieve a reduction in the cost of the apparatus. Further, the terminal contact surfaces of the first connectors are located at a position higher than the terminal contact surfaces of the second connecting members. The electronic part is mounted on the adapter and is pressed against the adapter. In this state, it is possible to carrying out the test in a state that the first terminals (for example, the control pins) are brought into contact with the first connecting members, and the second terminals are not brought into contact with the second connecting members. Thereafter, when the electronic part is further pressed, the second terminals (for example, the test pins) are brought into contact with the second connecting members. It is possible to carry out a next test in this state. In this manner, it is possible to successively carry out the tests at two stages without using a positioning member unlike the conventional practice.

In this case, it is possible to structure the apparatus in a similar manner to that described above such that, when the electronic part is pressed against the adapter for carrying out the electrical connection, the adapter can move in this pressing direction. With this arrangement, the electrical connection between the adapter and the testing member becomes more secure.

Further, it is preferable that each of the first and second connecting members are divided into an upper part and a lower part. Each connecting member includes a terminal contact surface for a contacting the terminals, an electronic part contact portion for contacting a conductive surface connected to the electrical connection pattern of the testing member, and an elastic member disposed between the terminal contact portion and the testing member contact portion. Further, it is preferable that at least one of the first connecting members and the second connecting members are accommodated within straight conductive pipes together with the elastic members. Based on this structure, it is easy to move the terminal contact portion by pressing the terminal, which makes it easy to carry out the tests at two stages. It is also possible to dispose the terminal contact portion and the testing member contact portion by pressing these against the electronic part and the testing member with the elastic member. This makes it possible to obtain a more secure electrical connection, which is preferable.

Further, as the straight pipe is used as described above, each connecting member has a simple structure as compared with the conventional probe structure having caulks. Thus, the number of parts and the number of assembling processes can be reduced, which makes it possible to reduce the cost of adapter parts for carrying out an electric connection. As the cost of connecting members that are the main parts of the adapter can be reduced, the total cost of the testing apparatus can be reduced. Further, as the pipe is provided, the friction between the connecting members and the inner wall surface of the pipe becomes less. As a result, the connecting members can be moved smoothly, and the tests at two stages can be carried out smoothly. An electrical connection between the terminal and the connecting member becomes more secure. It is preferable that the clearance is made smaller in at least a part of each connecting member and the pipe, to have electric conduction. The pipe can be disposed in one or both of the first and second connecting members. It is preferable that the first connecting members, the second connecting members and the elastic members are made of metal, respectively. It is also preferable that these members are provided with a conductive surface treatment. This makes it possible to obtain more satisfactory electrical conduction. The surface treatment may be provided on the front surface of each member, or may be provided on a part of the contact portion or the like. Further, it is preferable that the conductive pipe is constructed of a metal material or a metal material or a resin material on which a conductive surface treatment has been provided. This makes it possible to obtain a further satisfactory electrical conduction.

Further, it is preferable that a connecting member securing member is provided on the top surface of the adapter, and this connecting member securing member can be separated from the adapter. It is also preferable that the terminal contact portion and the testing member contact portion have enlarged portions which are accommodated within the pipe, and when the connecting member securing member is fixed to the adapter, the enlarged portions and the pipe are held within the adapter. With this arrangement, it is possible to secure the connecting members and the pipe within the adapter in a simple structure. Further, as it is possible to inspect and exchange the connecting members by only separating the connecting member securing member, the exchange of the connecting members can be carried out in a satisfactory work condition. This also facilitates the maintenance of the adapter. Further, as only the connecting member securing member can be separated from the adapter, it is possible to carry out the maintenance of the connecting members in a state that the adapter is positioned and fixed to the testing member.

Further, it is preferable that a knurl is formed on at least one of the terminal contact surface on which the terminal contact portion is in contact with the terminal and the testing member contact surface on which the testing member contact portion is in contact with the conductive surface. With this arrangement, it is possible to obtain an electrical connection more securely. Particularly, even when the other contact surface is a solder portion and the surface of this portion has been oxidized, it is possible to obtain a satisfactory contact state. It is preferable that the pitch of the projections of the knurl is about 0.2 mm, and it is more preferable that the pitch is about 0.1 mm. It is also possible to provide a conductive surface treatment on the inner wall surface of the hole within the adapter for accommodating at least one of the first connecting members and the second connecting members. With this arrangement, it is possible to obtain a further satisfactory electrical conduction and to omit the conductive pipe. This makes it possible to avoid the need of pipe parts and to simplify the assembling. Further, it is preferable that a first mask having a plurality of holes corresponding to a plurality of terminals to be tested among the plurality of terminals of the electronic part is provided at a side of the adapter where the electronic part is disposed. The terminals of the electronic part also include terminals that are not to be tested. However, even when holes are provided on the adapter corresponding to all the terminals, holes that are not necessary for the test can be closed as the first mask does not have holes corresponding to the terminals that are not to be tested. With this arrangement, it is possible to prevent in advance abnormal materials from invading the adapter from the unnecessary holes. Further, it is preferable that a second mask having a plurality of holes corresponding to each hole of the first and second connecting members of the adapter is disposed at the testing member. As it is possible to carry out the positioning with respect to the testing member by utilizing the holes of the second mask, it becomes easy to position the adapter and the tester member.

Further, according to a still further aspect of the invention, there is provided an electronic part testing apparatus for testing a connectability of a wiring pattern of an electronic part having a plurality of terminals. The electronic part testing apparatus comprises: a testing member having an electrical connection pattern, the electrical connection pattern being electrically connected to the terminals of the electronic part for the test; an adapter positioned between the electronic part and the tester member and establishing an electrical connection between the terminals and the electrical connection pattern when the electronic part is mounted for the testing. In this case, the terminals include a plurality of first terminals and a plurality of second terminals. For carrying out the electrical connection, the adapter includes first connecting members corresponding to the first terminals and second connecting members corresponding to the second terminals. The testing member includes through-holes provided corresponding to the first and second connecting members, respectively, and having on the inner wall surfaces conductive layer connected to the electrical connection pattern, and a testing member connecting member disposed within each through-hole to contact the conductive layer. Thus, the testing member connecting member has a contact with the first and second connecting members, respectively, to execute the electrical connection.

According to this electronic part testing apparatus, the conductive layer provided within the through-hole of the testing member is connected to the electrical connection pattern, and the connecting member is brought into contact with the conductive layer. Therefore, the connection route can be reduced, which becomes advantageous for a high-speed testing. By dividing the testing member connecting member into the two of the upper and lower parts, and by disposing the elastic member into between these two connectors, the electrical connection with each connecting member becomes more secure.

At least one of the first connecting members and the second connecting members can be structured by conductive vessels each having an opening into which the terminal can enter and a conductive medium filled in the vessel. This arrangement can more simplify the structure of the connecting members, and can reduce the number of connecting member parts. It is also possible to achieve a reduction in the total cost of the adapter. As the conductive medium, there can be used a known conductive powder, conductive liquid, conductive particle, fine-cut conductive fiber, particle-shaped conductive rubber, or the like. The conductive medium is not limited to the above. It is preferable that a gap is formed between the electronic part and the top surface of the adapter so that the surface of the electronic part does not contact the top surface of the adapter when the electronic part is disposed on the adapter for pressing the electronic part. With this arrangement, when the electronic part is mounted on the adapter and is pressed, the risk of a disconnection of the wiring pattern near the root of each pin of the electronic part can be avoided. A stress applied to the root of the pin can also be avoided, by preventing the terminal roots of the electronic part from hitting against the surface of the adapter.

Further, according to still another invention, there is provided an electric connector comprising: a first contact portion for having a contact with a first external contact portion; a second contact portion for having a contact with a second external contact portion; an elastic member disposed between the first contact portion and the second contact portion; and a straight-shaped pipe for accommodating therein the first contact portion, the second contact portion and the elastic member. In this case, the first contact portion and the second contact portion are electrically connected.

According to the electric connecting member of the present invention, the electric connecting member is disposed between a substrate and an electronic part for providing an electrical connection between these units or is disposed between an electronic part and another electronic part for providing an electrical connection between these electronic parts, not only for an electrical connection in the adapter. Therefore, it is possible to provide a secure electrical connection between the two units in a simple structure. This avoids the need for wiring and soldering, and facilitates both the exchange of parts and the maintenance. In order to obtain a more satisfactory electrical connection between the first contact portion the second contact portion, it is effective to provide a conductive surface treatment on each of these members.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

The present invention will now be described with reference to the attached drawings which show an electronic part testing apparatus and an electric connecting device.

Figure 1:
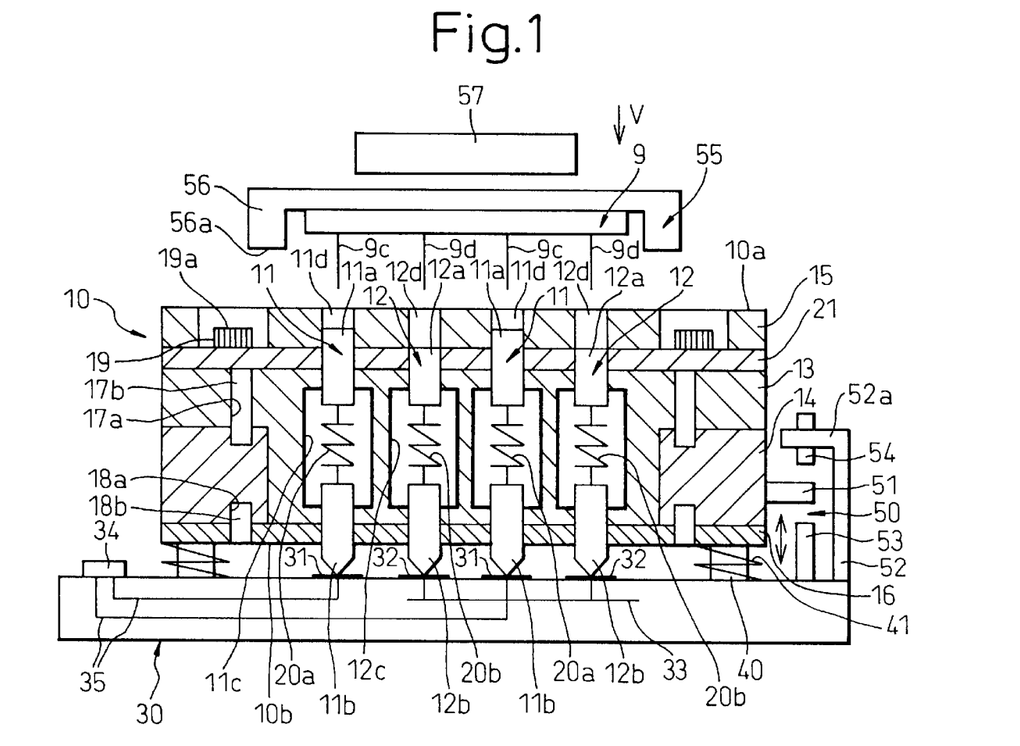
FIG. 1 is a schematic cross-sectional view of an electronic part testing apparatus according to a first embodiment of the present invention.
Figure 2:
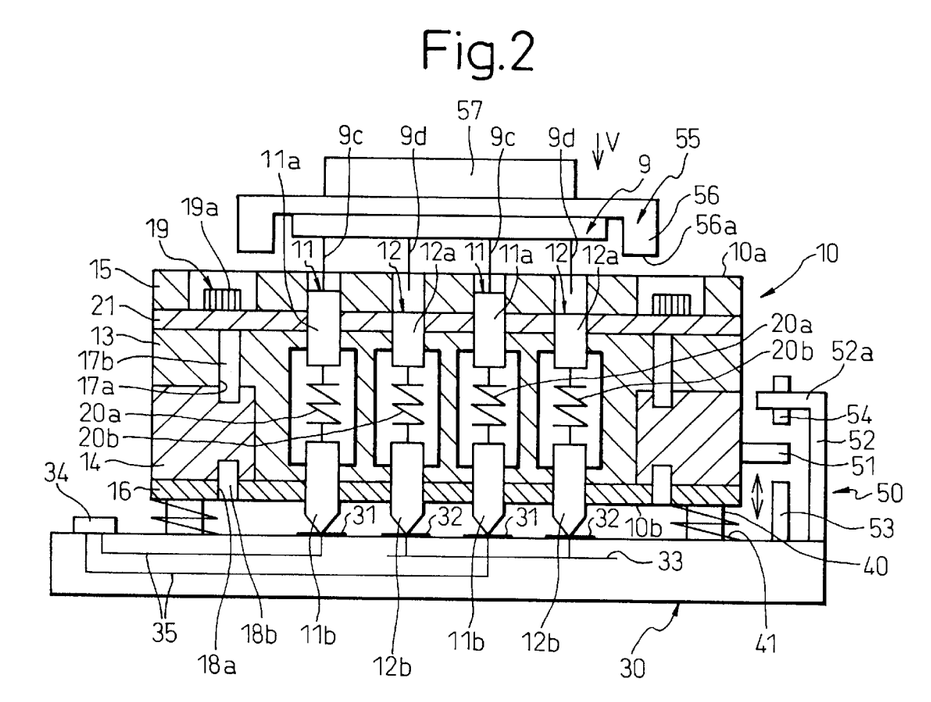
FIG. 2 is a schematic cross-sectional view showing the electronic part testing apparatus of FIG. 1 in the state of the first-step test.
Figure 3:
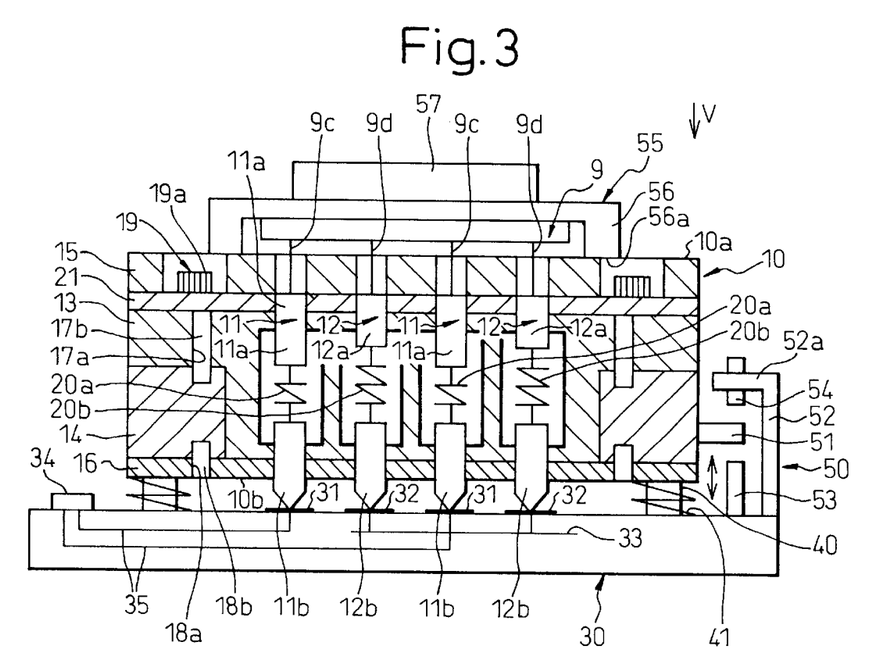
FIG. 3 is a schematic cross-sectional view showing the electronic part testing apparatus of FIG. 1 in the state where it is moved from the state of FIG. 2.
Figure 4:
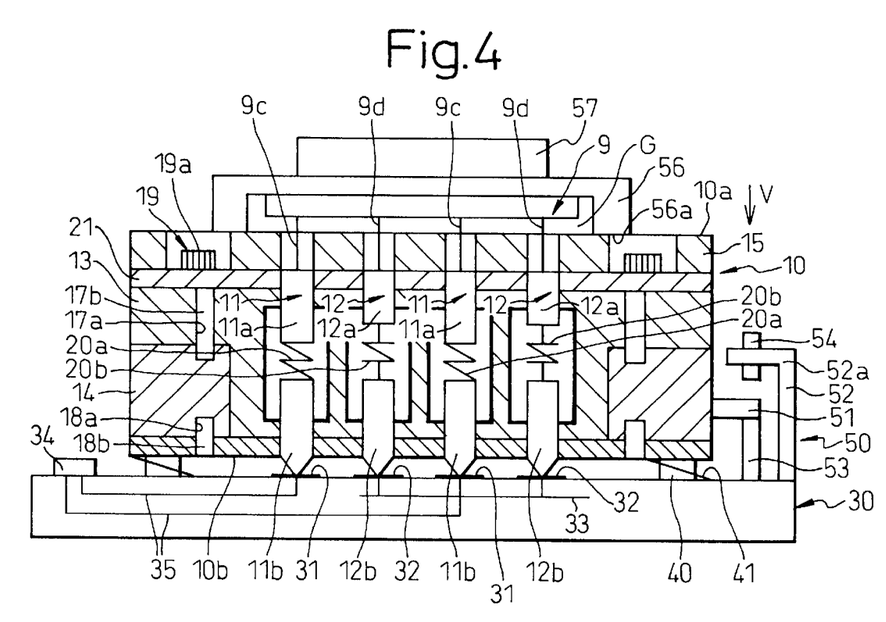
FIG. 4 is a schematic cross-sectional view showing the electronic part testing apparatus of FIG. 1 in the state of the second-step test.

FIG. 1 is a cross-sectional view of the electronic part testing apparatus according to the first embodiment of the present invention. FIGS. 2, 3 and 4 are cross-sectional views explaining testing steps of the electronic part testing apparatus shown in FIG. 1, respectively.

As shown in FIG. 1, the electronic part testing apparatus of this embodiment is constructed to test an electronic part 9 having a wiring pattern, and a large number of pin terminals including control pins 9c and test pins 9d, such as an MCM, an PGA package, a BGA package, etc. The electronic part testing apparatus includes an adapter 10 for establishing electrical connection with the pins 9c and 9d of the electronic part 9, the adapter 10 having an upper surface 10a and a lower surface 10b, a plate-shaped testing member 30 having a test connecting pattern to be electrically connected with the pins 9c and 9d via the adapter 10, guide members 40 fixed to the tester member 30 perpendicular thereto for supporting the adapter 10, and coil springs 41 as elastic members disposed around the guide members 40 between the testing member 30 and the lower surface 10b of the adapter 10. The adapter 10 has holes into which the guide members 40 enter, and can move while being guided by the guide members 40 that slide vertically within the holes.

The adapter 10 is made of an electrically insulating material such as a resin or a ceramic, and includes an adapter body 13 having a surface size corresponding to the electronic part 9 to be tested, an adapter peripheral member 14 for forming the periphery of the adapter around the lower portion of the adapter body 13, a plurality of first connecting members of assemblies 11 disposed corresponding to the control pins 9c of the electronic part 9 and a plurality of second connecting members or assemblies 12 disposed corresponding to the test pins 9d, with the connecting devices 11 and 12 arranged within through holes in the adapter body 13, a first mask 21 covering the upper surface of the adapter body 13 and having holes formed therein corresponding to the first and second connecting devices 11 and 12, respectively, an adapter guide 15 covering almost the whole surface of the first mask 21 and forming the upper surface 10a of the adapter 10, and a second mask 16 covering the lower surface of the adapter body 13 and having holes formed therein corresponding to the first and second connectors 11 and 12, respectively.

The adapter body 13 and the adapter peripheral member 14 have positioning holes 17a. Positioning pins 17b are inserted in the positioning holes 17a. Based on this positioning structure, the adapter body 13 and the adapter peripheral member 14 are easily positioned with high precision. Further, the adapter peripheral member 14 and the second mask 16 have positioning holes 18a and positioning pins 18b, respectively, so that the adapter peripheral member 14 and the second mask 16 are positioned with high precision.

The first mask 21 is explained with reference to FIG. 10. The electronic part 9, as an object to be tested, includes power source pins, GND pins, etc. in addition to the test pins 9d and the control pins 9c, all the pins having the same pin length. For mounting the electronic part 9 on the adapter 10 to carry out the test, the adapter guide 15 must have holes corresponding to all the pins of the electronic part 9. At the time of the testing, the test pins 9d, the control pins 9c and a part of the power source pins and the GND pins are brought into contact with the connecting members 11 and 12 in the adapter 10, and other pins are not brought into contact with the connecting devices 11 and 12. Therefore, the adapter body 13 beneath the adapter guide must have holes at positions where the connecting members 11 and 12 are located, but does not need to have holes at portions where the connecting devices 11 and 12 are located. Thus, it is possible to form the holes on the adapter body 13 selectively and only at necessary positions. However, such a selective processing is troublesome and takes time, and has a potential of a generation of a processing error due to data error. Therefore, in order to avoid this risk, holes are formed in the adapter body 13 at positions corresponding to all pins of the electronic part 9, in a similar manner to that of forming holes in the adapter guide 15.

Figure 10:
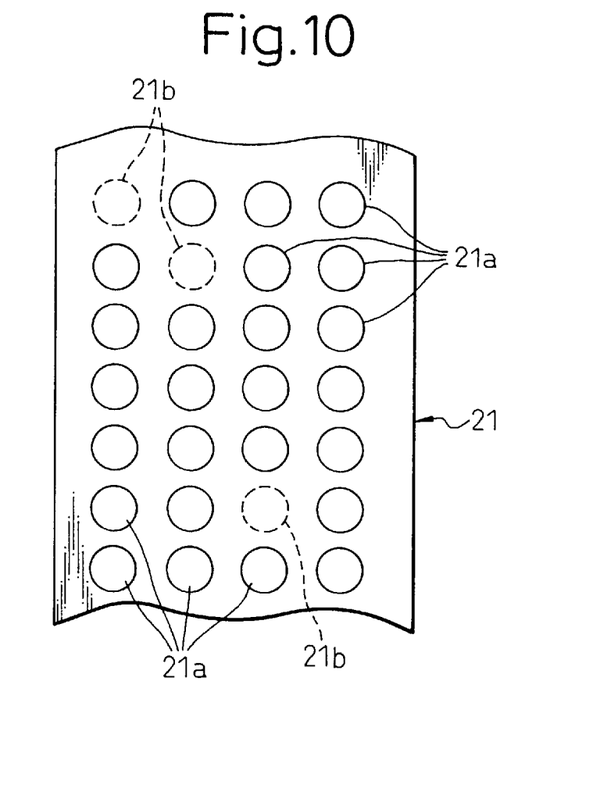
FIG. 10 is top plan view schematically showing the first mask of the electronic part testing apparatus of FIG. 1.

Thus, as shown in FIG. 10, the first mask 21 has holes formed at a large number of positions 21a where the connecting members are located, and does not have holes formed at positions 21b shown by broken lines in the drawing where the connecting members are not located. Accordingly, when the first mask 21 is disposed between the adapter body 13 and the adapter guide 15, it is possible to close the holes (portions corresponding to positions 21b in FIG. 10) of the adapter body 13 where the connecting members are not installed. As a result, it is possible to prevent foreign material from entering the adapter 10 from the surface of the adapter. This is effective for preventing foreign material from entering.

Further, the first mask 21 that has holes at only positions where the connecting members exist in the adapter and that has no holes at positions where the connecting members do not exist, has the following effect. It is not necessary to modify the whole adapter or to manufacture the adapter again when there is an error in forming holes in the adapter or when the connecting member positions are changed after processing. In this case, it is possible to cope with this situation by only modifying the first mask 21. As a result, it is possible to quickly cope with changes in the connecting member positions.

Further, fixing screws 19 for fixing the first mask 21, the adapter body 13 and the adapter peripheral member 14 are provided, and heads 19a of the fixing screw are accommodated in the adapter guide 15. The adapter guide 15 is detachably fixed to the adapter body 13 at positions other than the positions of the fixing screws 19. Therefore, it is possible to take out only the adapter guide 15 from the adapter 10. Thus, it is not necessary to disassemble the other parts of the adapter 10 when, for example, it is necessary to exchange or inspect the connecting members 11 and 12 within the adapter 10. As a result, it does not take time to inspect or exchange the connecting members 11 and 12 as this can be done easily, which is desirable.

The first and second connecting members 11 and 12 include metal upper pin contact portions 11a and 12a, metal lower pad contact portions 11b and 12b having edge-shaped tip ends, respectively, and metal coil springs 20a and 20b disposed as elastic members between the pin contact portions and the pad contact portions, the of the springs 20a and 20b being treated to enhance conductivity. The upper surface of the pin contact portion 11a of the connecting member 11 is located at a higher position than the upper surface of the pin contact portion 12a within the adapter 10. As each portion of the connecting members 11 and 12 is made of metal, the connecting members 11 and 12 are electrically conductive. Each portion of the connecting members may be provided with a conductive surface treatment. The conductive surface treatment includes a surface treatment of providing a nickel plating and providing a metal plating or a rhodium plating on the metal plating. However, the surface treatment is not limited to this method.

The testing member 30 has on the surface thereof conductive pads 31 disposed as conductive surfaces corresponding to the pad contact portions 11b of the first connecting elements 11, and conductive pads 32 disposed as conductive surfaces corresponding to the pad contact portions 12b of the second connecting members 12. All the pads 32 connected to the second connecting members 12 are mutually short-circuited by a short-circuiting layer 33 formed in the testing member 30. The pads 31 connected to the first connecting members 11 are connected to a connector 34 via wiring layers 35 of a predetermined pattern formed within the tester member 30. The control pins 9c of the electronic part 9 are connected to an external tester (not shown) via the connector 34.

The electronic part testing apparatus shown in FIG. 1 has a stopper mechanism 50 for the movable adapter 10, in which a stopper member 51 extending from the side surface of the adapter 10 is positioned between an abutment portion 53 extending perpendicularly from the testing member 30 and an abutment portion 54 provided on a horizontal portion 52a on the upper part of a supporting member 52 extending perpendicularly from the testing member 30. The vertical position of the adapter 10 is restricted between the abutment portions 53 and 54. However, the abutment portion 54 can be moved in the vertical direction to adjust the abutment position.

Next, a pressing member 55 for supporting the electronic part 9 when it is mounted to the adapter 10 will be explained. The electronic part 9 has the wiring pattern at the proximal ends of the pins 9c and 9d of the electronic part 9. When the proximal ends of the pins 9c and 9d are brought into contact with the surface of the adapter 10, there is a risk of damaging the wiring pattern. Therefore, when the electronic part 9 is mounted to the adapter 10 and the electronic part 9 is pressed from above, it is necessary to avoid a physical contact between the proximal ends of the pins of 9c and 9d of the electronic part 9 and the surface of the adapter 10. For this purpose, the pressing member 55 has depending portions. 56 at its ends, so that a gap G is formed between the electronic part 9 and the upper surface 10a of the adapter 10 when the bottom surfaces 56a of the depending portions 56 are brought into contact with the upper surface 10a of the adapter 10 (FIG. 4). It is also possible to obtain a similar effect when the pressing member is formed in a plate shape and a recess is formed in the plate material so as to correspond to the surface of the electronic part 9. Alternatively, projections may be provided on the upper surface 10a of the adapter 10 in such a way that a gap is formed between the electronic part 9 and the upper surface 10a of the adapter 10 when the projections are brought into contact with the pressing member 55. Alternatively, the upper surface 10a of the adapter 10 may be formed to have a recess corresponding to the shape of the electronic part 9.

The assembling process of the adapter 10 comprising the adapter peripheral member 14, the second mask 16, the adapter body 13, the first mask 21 and the adapter guide 15 will be explained next. First, the second mask 16 is positioned to the adapter peripheral member. 14 based on the positioning holes 18a and the positioning pins 18b. In this positioned state, the pads 31 and 32 of testing member 30 and the holes of the second mask 16 corresponding to the respective positions of the connecting members 11 and 12 are matched to each other by utilizing a microscope or the like, whereby the adapter peripheral member 14 and the second mask 16 are positioned to the testing member 30, and are supported by the guide member 40.

For positioning and fixing an adapter to a testing substrate, it has been a conventional practice that positioning holes are formed in the testing substrate, and pins are disposed in these holes to position the adapter. The positioning holes in the testing substrate and the pad positions on the testing substrate have been formed to secure a certain level of positioning precision within the range of the manufacturing of the testing substrate. However, as the shapes and the pitches of pads on the testing substrate have become fine, it has become difficult to secure precision of the positioning holes and the pad positions on the tester substrate. In order to improve this situation, the second mask 16 has holes for positioning the adapter body 10 in addition to the holes corresponding to the positions of the pads. Based on this arrangement, it is possible to position the connecting members 11 and 12 in the adapter 10 to the respective pads 31 and 32 of the testing member 30.

The adapter body 13 is then positioned and fixed to the adapter peripheral member 14 based on the positioning holes 17a and the positioning pins 17b. In this way, the pad contact portions 11b and 12b of the connecting members 11 and 12 in the adapter 10 are positioned with high precision on the pads 31 and 32 on the testing member 30. In this state, conical tip ends of the contact portions 11b and 12b are brought into contact with the pads 31 and 32. Next, the first mask 21 is installed on the adapter body 13 to cover the upper surface of the adapter body 13. Then, the whole first mask 21 is fixed with the fixing screws 19. Thereafter, the adapter guide 15 is fixed to the first mask 21. The adapter 10 can be assembled in this manner.

A procedure of testing by the electronic part testing apparatus shown in FIG. 1 will be explained next with reference to FIGS. 2 to 4. First, the pressing member 55 is installed on the electronic part 9. Then, the electronic part 9 is mounted on the adapter 10, and the electronic part 9 is pressed downward as shown by the arrow V in FIG. 1 with the pressing mechanism 57 via the pressing member 55. This pressing is carried out so that the control pins 9c are brought into contact with the pin contact portions 11a of the first connecting members 11 located at a position higher than the second connecting members 12 in the adapter 10 as shown in FIG. 2. In this case; a predetermined level of pressing is applied to maintain the state that the first connecting members 11 are slightly pressed downward and the test pins 9d are not brought into contact with the pin contact portions 12a of the second connecting members 12.

In the state shown in FIG. 2, a voltage is applied from the main test apparatus to the first connecting members 11 via the connector 34 of the testing member 30. An electrical short-circuiting test of the test pins 9d is carried out while controlling the voltage applied and observing the test apparatus (an electrical short-circuiting test at step 1).

Next, the electronic part 9 is further pressurized in the direction V toward the adapter 10 via the pressing member 55, with the pressing mechanism 57, and the electronic part 9 moves downward until the bottom surfaces 56a of the depending portions 56 provided at the ends of the pressing member 55 are brought into contact with the adapter upper surface 10a, as shown in FIG. 3. In this instance, the control pins 9c further press down the pin contact portions 11a against the elastic force of the coil springs 20a, and the test pins 9d are brought into contact with the pin contact portions 12a of the second connecting members 12 so that the second connecting members 12 are slightly pressed downward. When a further pressing force is applied by the pressing member 55 from this state, the adapter 10 as a whole is pressed down against the elastic force of the coil 10 springs 41 along the guide members 40, as shown in FIG. 4. When the stopper member 51 of the adapter 10 contacts the abutment portion 53, the adapter 10 stops.

In the state shown in FIG. 4, a voltage is applied from the main test apparatus to the first connecting members 11 via the connector 34 of the testing member 30.

An electrical continuity (or breakage) test of the test pins 9d is carried out while controlling the voltage applied and observing the test apparatus (an electrical continuity test at step 2).

At this time, the whole adapter 10 is pressed against the testing member 30, and the respective pad contact portions 11b and 12b of the connecting members 11 and 12 are pressed against the pads 31 and 32 more strongly than those in the state shown in FIG. 3. Therefore, it is possible to obtain more secure electrical connection between the pads 31 and 32 and the pad contact portions 11b and 12b, respectively. This makes it possible to carry out a more accurate electrical continuity test. Further, the test at the step 1 and the test at the step 2 can be carried out successively by using the same testing apparatus.

In addition, at the time of starting the above test, both the first and second connecting members 11 and 12 are located within the holes of the adapter 10, and openings lid and 12d are formed in the upper surface 10a of the adapter 10 corresponding to the pins 9c and 9d. Therefore, as shown in FIG. 2, it is possible to easily mount the electronic part 9 on the adapter 10 such that the pin terminals 9c and 9d enter the respective openings 11d and 12d. Accordingly, it is not particularly necessary to position the electronic part 9 on the adapter 10, and any conventional positioning member is not necessary. This simplifies the structure of the apparatus. Further, it is not necessary to position a conventional positioning member with the adapter, and this facilitates the test. The electronic part 9 has a large number of pins (for example, 6,000 pins at 0.9 mm pitch). Processing precision has been conventionally required in the positioning member and the adapter, but according to the present embodiment, the conventional positioning member is not necessary and the positioning operation of the positioning member with the adapter is not necessary either. Therefore, the requirement of processing precision is relaxed, compared with the prior art, and it has become possible to reduce the processing cost. Further, the number of components can also be reduced. As a result, it is possible to achieve a reduction in the total cost of the apparatus.

Figure 5:
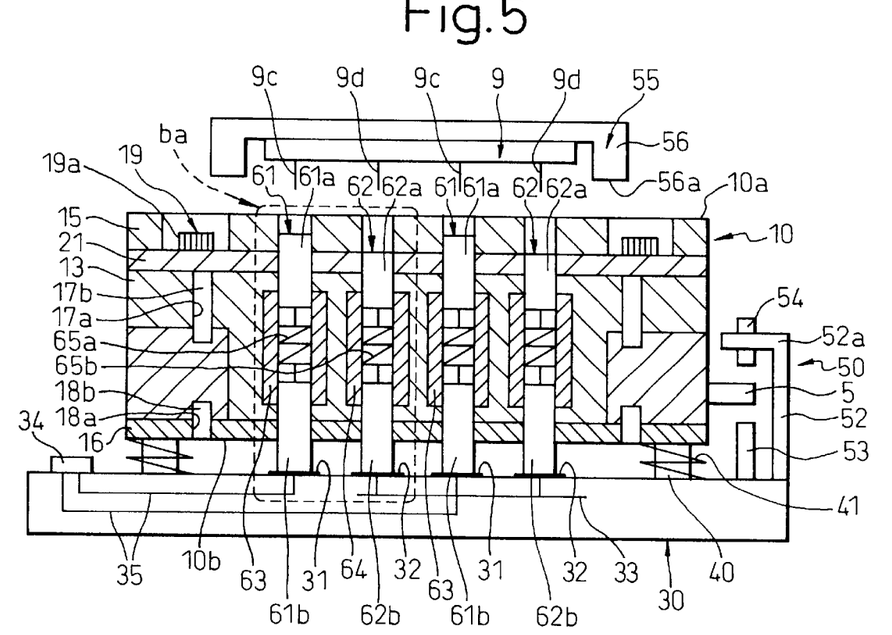
FIG. 5 is a schematic cross-sectional view showing a modified example of the electronic part testing apparatus of FIG. 1.
Figure 6:
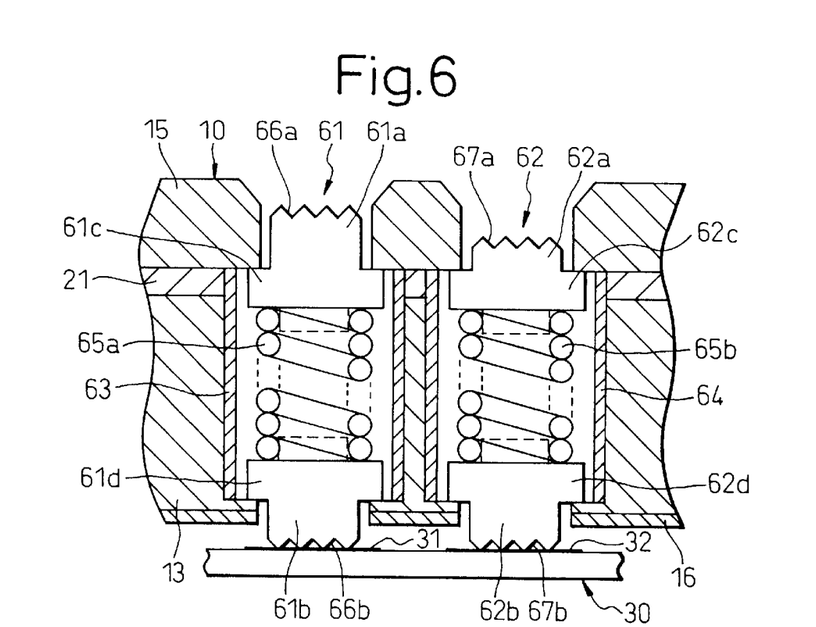
FIG. 6 is a cross-sectional diagram showing, in an enlarged scale, the connecting portion of FIG. 5.

A modified example of the connecting members of FIG. 1 will be explained with reference to FIGS. 5 and 6. This example shows a pipe structure arranged such that a straight metal pipe is disposed around each connecting member to improve the electric conductivity of the connector. FIG. 6 is an enlarged view of a "ba" portion in FIG. 5. As shown in detail in FIG. 6, a first connecting members 61 includes a pin contact portion 61a as a terminal contact portion, a pad contact portion 61b as a testing member contact portion, and a conductive surface-treated coil spring 65a disposed as an elastic member between the pin contact portion 61a and the pad contact portion 61b. Further, a metal straight pipe 63 is disposed in the adapter body 13, and accommodates therein the coil spring 65a and enlarged portions 61c and 61d. The enlarged portion 61c of the pin contact portion 61a and the enlarged portion 61d of the pad contact portion 61b are secured between the adapter guide 15 as a connecting member securing member and the adapter body 13. Similarly, a second connecting members 62 includes a pin contact portion 62a, a pad contact portion 62b, and a conductive surface-treated coil spring 65b disposed between the pin contact portion 62a and the pad contact portion 62b. Further, a metal straight pipe 64 is disposed in the adapter body 13, and accommodates therein the coil spring 65b and enlarged portions 62c and 62d. The enlarged portion 62c of the pin contact portion 62a and the enlarged portion 62d of the pad contact portion 62b are fixedly held between the adapter guide 15 and the adapter main body 13 as a connector holding member.

The enlarged portions 61c and 61d contact the inner wall of the pipe 63, and the enlarged portions 62c and 62d contact the inner wall of the pipe 64, to thereby improve electric conductivity. Each enlarged portion can slidably move in the inner wall surface of each pipe, so that friction of the inner wall surface of the adapter 10 is reduced as compared with the case where the pipes are not provided. As the pin contact portions 61a and 62a can move smoothly, it is possible to smoothly carry out tests at two stages, and it is possible to obtain more secure electrical connection between the pins 9c and 9d and the pin contact portions 61a and 62a, respectively. Also, end surfaces 66a and 67a of the pin contact portions and end surfaces 66b and 67b of the pad contact portions are respectively knurled (edge-shaped projections arranged in X-Y directions in the end surface) at a pitch 0.1 mm, for example, as shown in FIG. 6. This structure ensures the electrical connection between the pins and the pads. The pin contact portion 61a of the first connecting member 61 is structured to have a larger length than the pin contact portion 62a of the second connecting member 62 so that the end surface 66a of the pin contact portion 61a is located at a position higher than the end surface 67a of the pin contact portion 62a. With this arrangement, it is possible to carry out tests equivalent to those shown in FIG. 1 to FIG. 4.

As explained above, in the connecting members shown in FIG. 5 and FIG. 6, the straight pipes are used, and caulks are not necessary unlike the conventional probe structure (FIG. 14). Therefore, the structure becomes simple, and it is possible to achieve a reduction in the cost of the apparatus and the adapter. The pipe 63 further makes sure the electrical connection between the pin contact portion 61a and the pad contact portion 61b. Further, as the surfaces 65a, 65b, 66a and 66b are knurled, which ensure a satisfactory electrical connection when the contact is carried out repeatedly. Further, even when the connection surface is an oxidized solder surface or the like, the electrical connection can be surely made. As explained above, according to the pipe structure of the connectors in the present example, the apparatus can be provided with a simple structure at a reduced cost. Further, it is possible to obtain a secure electrical connection. It is possible to further improve the electrical connection when a conductive surface treatment is provided on the outer periphery of each of the stages 61c, 61d, 62c and 62d of the respective connectors.

For improving conductivity and slidability of the connecting members, as a still another example, a surface treatment can be provided to form a conductive layer on each of the inner wall surfaces 11c and 12c (FIG. 1 to FIG. 4). Connecting members 11 and 12 within the adapter body 13 made of an electrically insulating material are accommodated inside these conductive layers, respectively. With this arrangement, it is possible to improve the conductive characteristic of the connecting members 11 and 12 that are brought into contact with a part of the conductive layers (a thick line portion in FIG. 1 to FIG. 4) formed on the inner wall surfaces 11c and 12c, respectively. Further, slidability is also improved because of a reduction in the friction between the connecting members and the inner walls. Further, the pipe portions can be omitted from the structures shown in FIG. 5 and FIG. 6. This reduces the number of parts, and can simplify the structure of the connectors, resulting in a compact structure.

The conductive surface treatment in the present example includes a surface treatment of providing a nickel plating and providing a metal plating or a rhodium plating on the metal plating. However, the surface treatment is not limited to this method.

Figure 7:
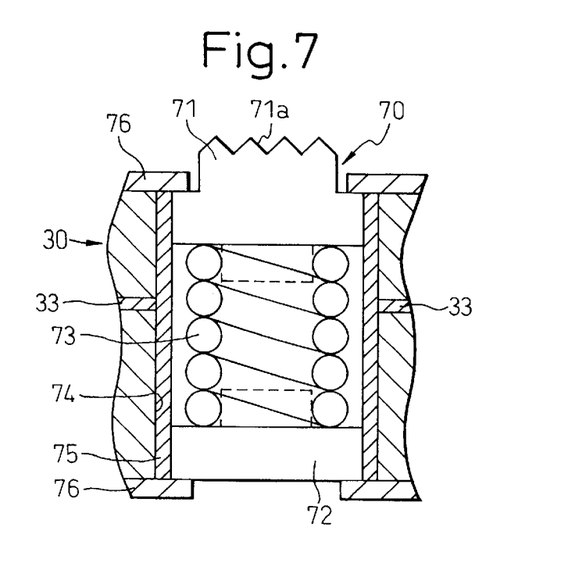
FIG. 7 is a schematic cross-sectional view showing a modified example of the testing member of the electronic part testing apparatus of FIG. 1.

Next, a modified example in which a connecting member is installed in a through-hole of a testing member will be explained with reference to FIG. 7. According to this example, a through-hole 74 is provided at a portion of a testing member 30 where a short-circuiting layer 33 is formed. A conductive surface treatment using copper, for example, is provided on the inner wall surface of the through-hole 74, thereby to form a conductive layer 75. The conductive layer 75 is electrically connected to the short-circuiting layer 33 within the testing member 30. A connecting member 70 includes a pad 71 having a knurled pad surface 71a, a spring support 72, and a coil spring 73 disposed as an elastic member between the pad 71 and the spring support 72. The connecting member 70 is arranged within the through-hole 74, and is supported by pressing plates 76 on the upper and lower surfaces of the testing member 30. According to this example, as the connecting member 70 is embedded in the through-hole 74 in the testing member 30, it is not necessary to connect the conductive pad with the short-circuiting layer in the testing member 30. As the electric transmission route is shortened, this structure is advantageous for carrying out a high-speed test. The pad 71 is pressed against the connecting member of the adapter 10 by the coil-spring 73 to be in contact with the connecting member. This ensures the electrical connection.

Figure 8:
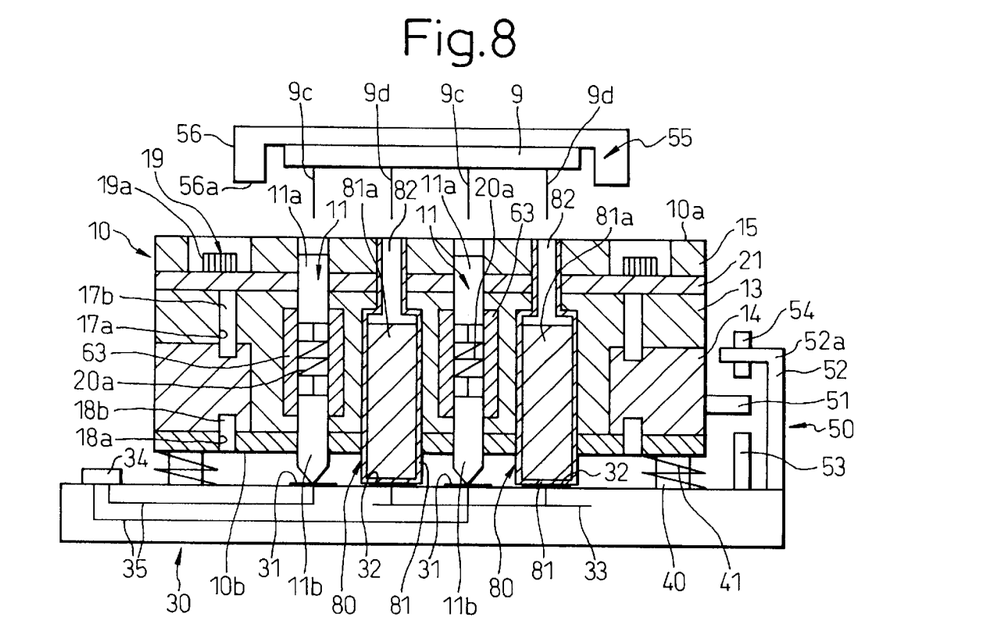
FIG. 8 is a schematic cross-sectional view showing a modified example of the electronic part testing apparatus shown in FIG. 1.

Next, a further modified example is explained in which a conductive medium is used as an electrical short-circuiting unit for short-circuiting between a connecting member within an adapter and a pin, with reference to FIG. 8. As shown in FIG. 8, conductive vessels 80 each having an opening 82 are disposed within an adapter 10 corresponding to test pins 9*d* of an electronic part 9. A conductive medium 81 is accommodated in each vessel 80. Upper surfaces 81*a* of the mediums are located at a position lower than the upper surfaces of pin connectors 11*a* of first connecting members 11. The bottom surface of each vessel 80 is brought into contact with a pad 31 of a testing member 30. With this arrangement, it is possible to carry out tests at two steps in a similar manner to that as explained with reference to FIG. 1 to FIG. 4. For carrying out a test, each test pin 9*d* enters from the opening 82 and is brought into contact with the medium upper surface 81*a*. Thus, this exhibits a function of the second connecting member. The second connecting members can be structured by only filling the conductive medium into the vessel. A contact surface for having contact with the pins can be easily adjusted by adjusting the filled quantity of the conductive medium. This simplifies the structure, and reduces the number of components of the connecting members, leading to a reduction in the total cost of the adapter. As the conductive medium, it is possible to use known conductive powders, conductive liquid, conductive particles, fine-cut conductive fibers, a particle-shaped conductive rubber, or the like. Any one of these conductive mediums can be freely filled into the vessel because of their fluidity. Each first connecting member has a structure using the straight pipe 63 shown in FIG. 5 in the structure of FIG. 1. However, it is also possible to provide a structure having a conductive medium filled into a conductive vessel similar to that of the present example.

An electric connecting member according to a further embodiment of the present invention will be explained with reference to FIG. 9. The electric connecting member is structured such that the structure of the connecting member substantially similar to that explained with reference to FIG. 5 and FIG. 6 can be used to obtain an electrical connection between an electronic part and another electronic part, or between an electronic part and a substrate. An electric connecting member 90 shown in FIG. 9 includes a first contact portion 91, a second contact portion 92, a coil spring 93 as an elastic member disposed between the first contact portion and the second contact portion arranged to be compressed downward as shown in the drawing, and a straight pipe 94 for accommodating therein an enlarged portion 91*b* of the first contact portion 91, an enlarged portion 92*b* of the second contact portion 92 and the coil spring 93.

Each of the members 91 to 94 is made of metal. There is an electrical conductivity between the first contact portion 91 and the second contact portion 92. When the outer peripheral surface of each of the enlarged portions 91*b* and 92*b* is made slidable in the inner wall surface 94*a* of the pipe 94, it is possible to obtain more satisfactory conductivity and movement of the contact portions. End surfaces 91*a* and 92*a* of the contact portions 91 and 92 respectively are formed in a knurled shape (in the X-Y directions of the end surface) at a pitch of 0.1 mm, for example, to have an improved electrical connection with the other member.

Figure 9:
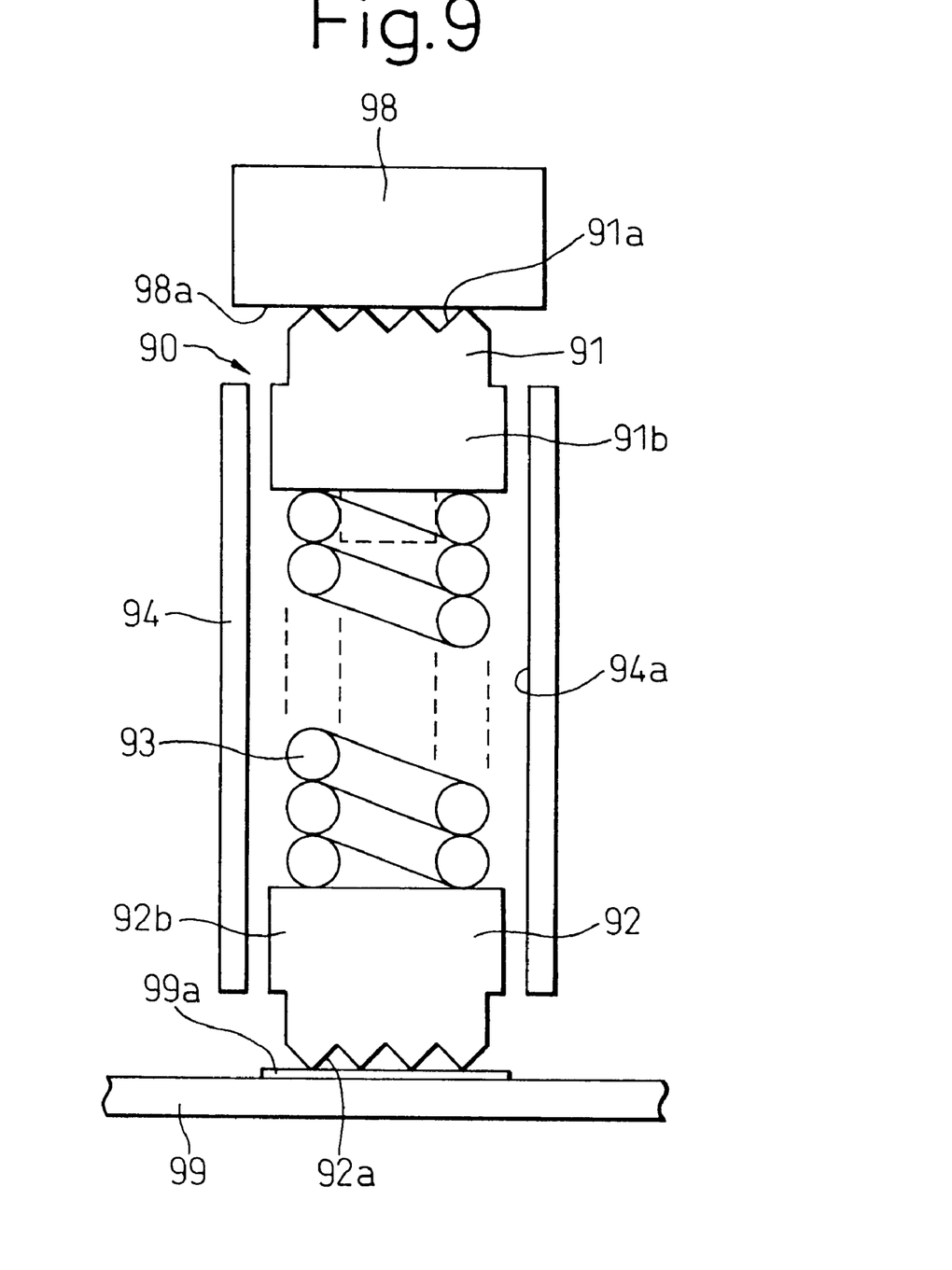
FIG. 9 is a schematic cross-sectional view of an electric connecting member according to a further embodiment of the present invention.

The connecting member 90 having the above structure is disposed between an electrical connection surface 98*a* of an electronic part 98 and a conductive layer 99*a* of a substrate 99 by compressing the coil spring 93, as shown in FIG. 9. Thus, the electronic part 98 is electrically connected to the substrate 99. In this case, the end surfaces 91*a* and 92*a* are strongly pressed against the electrical connection surface 98*a* and the conductive layer 99*a* respectively based on the elastic restoring force of the coil spring 93 due to the compression force of the coil spring. This ensures the electrical connection.

According to the electric connecting member of the present embodiment, when the electric connecting member is disposed between a substrate and an electronic part or between an electronic part and another electronic part for having an electrical connection respectively, it is possible to securely connect the two parts in a simple structure. Further, wiring and soldering are not necessary, and parts exchanges during the maintenance become easy. This facilitates the maintenance work. The electric connecting member of the present embodiment can be applied to various kinds of electronic devices. The electric connecting member can have a flexible size of either a large size or a small size, and has a large range of application. As explained above, each member may be provided with a conductive surface treatment by providing a nickel plating and providing a metal plating or a rhodium plating on this metal plating. This makes it possible to have a more satisfactory electrical conduction between the first contact portion and the second contact portion. This conductive surface treatment may be provided by other method.

According to the present invention, it is possible to provide an electronic part testing apparatus having an adapter capable of securely carrying out an electrical connection between an electronic part and a testing member at the time of testing an electrical connectability of a wiring pattern of the electronic part.

It is also possible to provide an electronic part testing apparatus capable of successively carrying out a plurality of tests by using the same apparatus without using a positioning member for fixing an electronic part and positioning a large number of pins.

It is possible to provide an electric connecting member capable of securing an electrical connection between an electronic part and a testing member. An electric connecting member can further secure an electrical connection between another electronic part and a substrate or between an electronic part and another part.

What is claimed is:

1. An electronic part testing apparatus for testing a connectability of a wiring pattern of an electronic part having a plurality of terminals, said apparatus comprising:

a testing member including an electrical connection pattern, said electrical connection pattern being electrically connected to said terminals of the electronic part for the test; and an adapter positioned between the electronic part and the testing member;

said adapter comprising electrical connections between said terminals and said electrical connection pattern when the electronic part is mounted on the adapter for the test;

said adapter being movable toward said testing member when the electronic part is pressed against the adapter for carrying out the electrical connection;

said adapter comprising a body, including holes, and connecting members arranged in said holes, wherein said connecting members are movable with said body and also movable relative to said body.

2. An electronic part testing apparatus according to claim 1, comprising an elastic member disposed between the adapter and the testing member.

3. An electronic part testing apparatus according to claim 2, further comprising:
   guide members fixed to the testing member and inserted in holes formed in the adapter, so that said adapter is movably supported by the guide members which are slidable in said holes.

4. An electronic part testing apparatus for testing a connectability of a wiring pattern of an electronic part having a plurality of terminals, said apparatus comprising:
   a testing member including an electrical connection pattern, said electrical connection pattern being electrically connected to said terminals of the electronic part for the test;
   an adapter positioned between the electronic part and the testing member;
   said adapter comprising electrical connections between said terminals and said electrical connection pattern when the electronic part is mounted on the adapter for the test;
   said terminals including a plurality of first terminals and a plurality of second terminals;
   said adapter including holes corresponding to said first and second terminals and first and second connecting members accommodated in said holes, respectively, said first and second connecting members having terminal contact surfaces positioned within said holes; and
   said terminal contact surfaces of said first connecting members being located at a higher position than said terminal contact surfaces of said second connecting members;
   said adapter comprising a body, including the holes, with said first connecting members and said second connecting members being arranged in said holes, wherein said first connecting members and said second connecting members are movable with said body and also movable relative to said body.

5. An electronic part testing apparatus according to claim 4, wherein when the electronic part is pressed against the adapter for establishing the electrical connection, said adapter is movable in the pressing direction.

6. An electronic part testing apparatus according to claim 5, wherein each of the first and second connecting members comprises a terminal contact portion contacting said terminals, a testing member contact portion contacting a conductive surface connected to said electrical connection pattern of said testing member, and an elastic member disposed between the terminal contact portion and the testing member contact portion; and
   said adapter further comprising straight conductive pipes arranged to accommodate at least one of said first and second connecting members together with the elastic members.

7. An electronic part testing apparatus according to claim 6, wherein said terminal contact portion, said testing member contact portion and said elastic member comprise metal, and include a conductive surface treatment.

8. An electronic part testing apparatus according to claim 6, wherein the conductive pipe comprises metal, or one of metal and resin including a conductive surface treatment thereon.

9. An electronic part testing apparatus according to claim 6, further comprising a connecting member securing member provided on a top surface of the adapter, said connecting member securing member being separable from the adapter, said terminal contact portion and said testing member contact portion including enlarged portions accommodated within the pipe, the enlarged portions and the elastic member being held within the adapter when the connecting member securing member is fixed to the adapter.

10. An electronic part testing apparatus according to claim 6, comprising a knurl on at least one of the terminal contact surface of the terminal contact portion to contact the terminal and the testing member contact surface of the testing member contact portion to contact the conductive surface.

11. An electronic part testing apparatus according to claim 4, comprising a conductive surface treatment on the inner wall surface of the each hole in the adapter that accommodates at least one of the first and second connecting members.

12. An electronic part testing apparatus according to claim 4, further comprising a first mask including a plurality of holes corresponding to the terminals to be tested among said terminals of the electronic part provided on the adapter on the side thereof where the electronic part is disposed.

13. An electronic part testing apparatus according to claim 12, further comprising a second mask including a plurality of holes corresponding to holes for said first and second connecting members of the adapter disposed on the adapter on the side where the testing member is arranged.

14. An electronic part testing apparatus for testing a connectability of a wiring pattern of an electronic part having a plurality of terminals, said apparatus comprising:
   a testing member including an electrical connection pattern, said electrical connection pattern being electrically connected to said terminals of the electronic part for the test;
   an adapter positioned between the electronic part and the testing member;
   said adapter comprising electrical connections between said terminals and said electrical connection pattern when the electronic part is mounted on the adapter for the test;
   said terminals including a plurality of first terminals and a plurality of second terminals;
   said adapter including first connecting members corresponding to the first terminals and second connecting members corresponding to the second terminals; and
   said testing member including through-holes corresponding to the first and second connecting members, respectively, including on inner wall surfaces conductive layers connected to the electrical connection pattern, and testing member connecting members disposed within the through-holes to contact the conductive layers,
   whereby the testing member connecting members contact the first and second connecting members, respectively, to establish the electrical connection.

15. An electronic part testing apparatus according to claim 4, wherein at least one of the first and second connecting members comprises a conductive vessel including an opening into which the terminal enters and a conductive medium is filled.

16. An electronic part testing apparatus according to claim 1, comprising a gap between the electronic part and a top surface of the adapter so that the surface of the electronic part does not contact the top surface of the adapter when the electronic part is disposed on the adapter for pressing the electronic part toward the adapter.

17. An electric connecting member comprising:

a first contact portion for contacting a first external contact portion;

a second contact portion for contacting a second external contact portion;

an elastic member disposed between the first contact portion and the second contact portion; and a conductive straight pipe accommodating therein the first contact portion, the second contact portion and the elastic member, whereby the first contact portion and the second contact portion are electrically connected; wherein the first contact portion, the elastic member, and the second contact portion are all freely movable through the conductive straight pipe, the conductive straight pipe is secured between two members, and the first contact portion and the second contact portion each includes a respective enlarged side portion contacting respective ones of said members.

18. The electric connecting member according to claim 17, wherein the conductive straight pipe comprises a first electric path from the first contact portion to the second contact portion; and the elastic member comprises a second electric path from the first contact portion to the second contact portion;

whereby the first contact portion and the second contact portion are better electrically connected.

19. The electric connecting member according to claim 17, wherein the first contact portion and the second contact portion each includes exactly ne enlarged side portion.

* * * * *